(12) United States Patent
Sams et al.

(10) Patent No.: US 11,794,131 B2
(45) Date of Patent: Oct. 24, 2023

(54) POWER UNIT PHASE ANGLE FOR SEPARATION UNIT CONTROL

(71) Applicant: Schlumberger Technology Corporation, Sugar Land, TX (US)

(72) Inventors: Gary W. Sams, Spring, TX (US); S. Pavankumar B. Mandewalkar, Houston, TX (US)

(73) Assignee: CAMERON INTERNATIONAL CORPORATION, Houston, TX (US)

(*) Notice: Subject to any disclaimer, the term of this patent is extended or adjusted under 35 U.S.C. 154(b) by 215 days.

(21) Appl. No.: 17/294,479

(22) PCT Filed: Nov. 21, 2019

(86) PCT No.: PCT/US2019/062577
§ 371 (c)(1),
(2) Date: May 17, 2021

(87) PCT Pub. No.: WO2020/106937
PCT Pub. Date: May 28, 2020

(65) Prior Publication Data
US 2021/0402327 A1   Dec. 30, 2021

Related U.S. Application Data

(60) Provisional application No. 62/770,346, filed on Nov. 21, 2018.

(51) Int. Cl.
*B01D 17/06* (2006.01)
*B01D 17/04* (2006.01)
*B01D 17/12* (2006.01)
*H03K 5/01* (2006.01)
*H03K 5/00* (2006.01)

(52) U.S. Cl.
CPC ............. *B01D 17/06* (2013.01); *B01D 17/04* (2013.01); *B01D 17/12* (2013.01); *H03K 5/01* (2013.01); *H03K 2005/00286* (2013.01)

(58) Field of Classification Search
CPC ................................ B01D 17/06; B01D 17/12
See application file for complete search history.

(56) References Cited

U.S. PATENT DOCUMENTS

| | | |
|---|---|---|
| 5,095,758 A | 3/1992 | Cox et al. |
| 8,357,283 B2 | 1/2013 | Kao |

(Continued)

FOREIGN PATENT DOCUMENTS

| | | |
|---|---|---|
| AR | 014310 A1 | 2/2001 |
| AR | 049786 A1 | 9/2006 |

(Continued)

OTHER PUBLICATIONS

Machine translation of CN101474497 of Wang (Year: 2009).*
(Continued)

*Primary Examiner* — Brian W Cohen

(57) ABSTRACT

Embodiments described herein provide a method of separating a liquid mixture, comprising providing a liquid mixture to a separator, electrically coupling a power circuit to the liquid mixture inside the separator, applying a time-varying voltage to the power circuit, detecting a phase angle in the power circuit; and controlling the phase angle by adjusting a characteristic of the time-varying voltage.

9 Claims, 5 Drawing Sheets

(56) References Cited

U.S. PATENT DOCUMENTS

| | | | |
|---|---|---|---|
| 2001/0017264 A1* | 8/2001 | Klippel | B01D 17/06 |
| | | | 204/555 |
| 2005/0230296 A1 | 10/2005 | Edmondson | |
| 2010/0215961 A1 | 8/2010 | Aubry et al. | |
| 2015/0290559 A1 | 10/2015 | Collins, Jr. et al. | |
| 2017/0157536 A1 | 6/2017 | Mandewalkar et al. | |
| 2017/0232364 A1* | 8/2017 | Johansen | B03C 11/00 |
| | | | 307/109 |
| 2017/0291122 A1 | 10/2017 | Lipkens et al. | |
| 2018/0371876 A1* | 12/2018 | Lopez | C10G 33/04 |

FOREIGN PATENT DOCUMENTS

| | | | |
|---|---|---|---|
| AR | 073321 A1 | | 10/2010 |
| CN | 101474497 A | * | 7/2009 |
| EP | 1096238 A1 | | 5/2001 |
| EP | 3563934 A1 | | 11/2019 |
| JP | 2003024350 A | | 1/2003 |

OTHER PUBLICATIONS

International Search Report and Written Opinion issued in the PCT Application PCT/US2019/062577, dated Mar. 10, 2020 (9 pages).

* cited by examiner

POWER UNIT PHASE ANGLE FOR SEPARATION UNIT CONTROL

CROSS-REFERENCE TO RELATED APPLICATION

The present document is based on and claims priority to U.S. Provisional Application Ser. No. 62/770,346, filed Nov. 21, 2018, which is incorporated herein by reference in its entirety.

FIELD

This application generally relates to processing associated with oil and gas extraction. Specifically, this application relates to electrical separators for separable liquids.

BACKGROUND

A common problem in oil and gas extraction is disposal of water produced from hydrocarbon reservoirs. The water is frequently extracted along with hydrocarbon. Hydrocarbon cannot be transported or refined with water, so the hydrocarbon is separated from the water. Often, the water is finely dispersed in the oil phase to form an emulsion that takes time to settle naturally. Measures are thus typically employed to speed the separation.

Electric fields are typically employed to speed separation of oil and water. The water typically has some amount of salt that increases its conductivity and its reaction to the effect of an electric field relative to oil. Electrodes are immersed in the oil water mixture, and power is applied to the electrodes to enhance separation of the phases. Typically, electrostatic separators operate continuously, with a stream of material coming out of a producing hydrocarbon reservoir and being charged to the separator, and streams of separated oil and water coming out of the separator. The stream coming out of the producing hydrocarbon reservoir is often variable and unpredictable, so controlling the separator to avoid breakthroughs of water in the oil, or oil in the water, due to excursions in the properties and composition of the material charged to the separator, is desirable. There is a need for improved methods of controlling electrostatic separators.

SUMMARY

Embodiments described herein provide a method of separating a liquid mixture, comprising providing a liquid mixture to a separator, electrically coupling a power circuit to the liquid mixture inside the separator, applying a time-varying voltage to the power circuit, detecting a phase angle in the power circuit, and controlling the phase angle by adjusting a characteristic of the time-varying voltage.

Other embodiments described herein provide a method of separating a liquid mixture, comprising providing a liquid mixture to a separator, electrically coupling a power circuit comprising a powered electrode to the liquid mixture inside the separator, applying a time-varying voltage to the powered electrode, coupling a reference potential to the liquid mixture using an electrical conductor, detecting a phase angle in the electrical conductor, minimizing the phase angle by adjusting a characteristic of the time-varying voltage, comparing the characteristic of the first time-varying power to a standard, and adjusting an aspect of the separation process based on the comparison.

Other embodiments described herein provide a method of performing a separation process, comprising providing a plurality of feed streams to a separation plant, each feed stream comprising at least two separable liquid phases, the separation plant comprising a plurality of separation trains, each separation train comprising at least two electrical separators, at least one of which is powered by time-varying voltage, flowing the feed streams through respective separation trains while applying time-varying voltage to at least one separator of each separation train, detecting or determining the phase angle in a power circuit of each separator receiving time-varying voltage, using a controller for each separator to adjust a characteristic of the time-varying voltage for that separator based on the phase angle of that separator, providing operating parameters of the separators to a data acquisition and analysis system, comparing the operating parameters of the separators in the data acquisition and analysis system, and adjusting the goal of each controller based on the comparison.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only exemplary embodiments and are therefore not to be considered limiting of its scope, may admit to other equally effective embodiments.

To facilitate understanding, identical reference numerals have been used, where possible, to designate identical elements that are common to the figures. It is contemplated that elements and features of one embodiment may be beneficially incorporated in other embodiments without further recitation.

DETAILED DESCRIPTION

Figure 1:
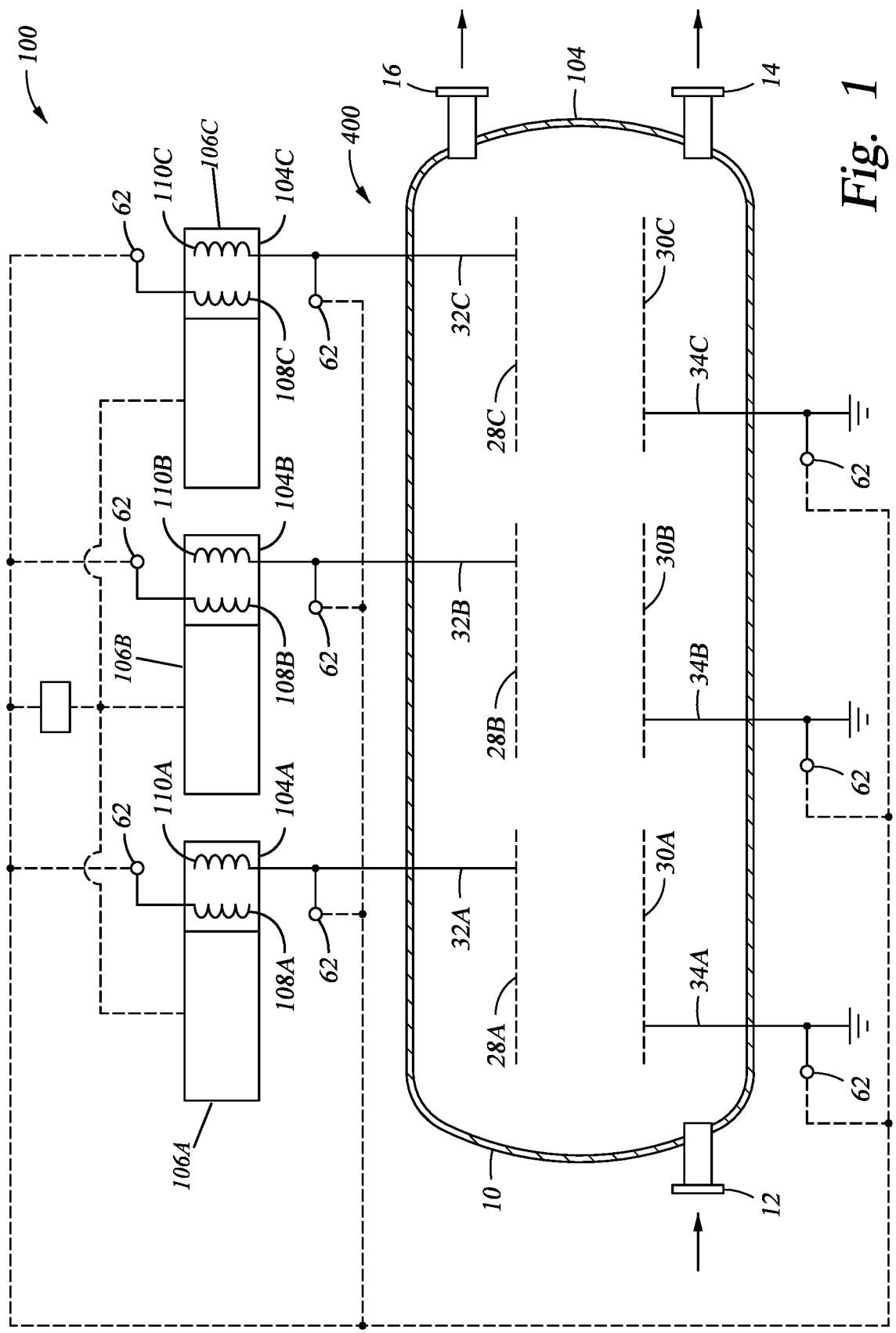
FIG. 1 is a schematic side view of a separation apparatus according to one embodiment.

FIG. 1 is a schematic cross-sectional view of a separation apparatus 100 according to one embodiment. The separation apparatus 100 includes a vessel 10 having an inlet 12, a heavy component outlet 14 and a lighter component outlet 16. The heavy component outlet 14 is usually in a lower part of the vessel 10, and may be at the bottom of the vessel 10. The lighter component outlet 16 is in an upper part of the vessel 10 and may be at the top of the vessel 10. A mixture of heavy and light liquids, which may also include some gas, is provided to the inlet 12, and electrical means are employed in the apparatus 100 to enhance separation of the heavy and light components of the mixture into two phases. The liquid mixture is typically charged to the vessel 10 using a distributor, which may be positioned at any convenient location within the vessel 10.

The electrical means used to enhance separation of the liquid phases is an electric field applied to the liquid mixture inside the vessel 10. An electrode is immersed in the liquid mixture to apply the electric field, thus creating a voltage within the liquid mixture that enhances the speed with which the liquid phases separate based on the different electrical characteristics of the liquid phases. One electrode may be powered to apply voltage to the liquid mixture. Alternately, as shown in FIG. 1, a plurality of electrodes may be used. The plurality of electrodes may be arranged in one or more pairs, as shown in FIG. 1. Thus, for a given electrode pair, one electrode may be powered while the other is electrically coupled to a reference potential. As shown in FIG. 1, a plurality of powered electrodes 28 are here paired with a plurality of respective reference electrodes 30, where in each pair, the powered electrode 28A/B/C is coupled to power and the respective reference electrode 30A/B/C is coupled to a reference potential, which may be the same or different in each case. In a single-electrode case, a reference potential may be coupled to the liquid mixture in the vessel 10 using a conductor electrically coupled to the liquid mixture, either as an electrode immersed in the liquid mixture, coupled to the vessel 10, or coupled to one or more of the power sources.

One or more power units 106 apply power to the liquid mixture to create the voltage. Here, three power units 106A, 106B, and 106C are shown, each coupled to a respective powered electrode 28 of an electrode pair. In this disclosure, items referred to using reference numerals with alphanumeric suffixes, such as "106A," are referred to in aggregate using the reference numeral without any alphanumeric suffix, such as "106." Thus, use of the reference numeral 106, in this disclosure, refers to all individual uses of 106 with alphanumeric suffixes, such as 106A, 106B, etc., where such individual uses occur. Use of the reference numeral 106 may also refer to a single instance of the item where an embodiment has only one instance of the item. Thus, if the reference numeral 106 is used, and the context indicates there is only one item 106, the reference is to a single instance of the item 106. If the reference numeral 106 is used, and the context indicates that there are multiple items 106A, 106B, etc., the reference to 106 refers to all instances of the item 106 collectively or as individual elements. Where embodiments may have a single or multiple instances of an item, for example the item 106, reference to "106" can also refer to the single item and the multiple items.

In a case where a single power unit 106 is used, the power unit may be coupled to a single electrode or to multiple electrodes immersed in the liquid mixture. The power units 106 here each include a transformer 104, respectively transformers 104A, 104B, and 104C, to provide a defined voltage to the liquid mixture. The transformers 104 have primary circuits 108 (108A, B, and C here) connected to power (not shown) and secondary circuits 110 (110A, B, and C here) connected to respective electrodes 28. The secondary circuits 110, in each case, are electrically coupled to a powered electrode 28, respectively electrodes 28A, 28B, and 28C in this case. The powered electrodes 28 acquire an electric potential from the secondary circuits 110 and energize an electric field within the liquid mixture. In this case, each powered electrode 28A, 28B, and 28C is adjacent to a respective reference electrode 30A, 30B, and 30C. As mentioned above, reference electrodes 30 immersed in the liquid mixture are optional. Also as mentioned above, using more than one electrode 28, or more than one electrode pair 28/30, is optional. The electrodes 28 and 30 are also shown here in a horizontal orientation, but may be in any orientation, including vertical and angled.

The power units 106 apply voltage to the electrodes 28. The voltage may be substantially constant or may be time-varying. When a time-varying voltage is applied to the primary circuit 108 of a transformer 104, the corresponding secondary circuit 110 acquires a time-varying voltage, which is applied to the liquid mixture in the vessel 10 by the connected electrode 28. Thus, each power unit 106 may apply a time-varying voltage to the liquid mixture. The time-varying voltage may vary according to any characteristic including amplitude, frequency, modulation, voltage gain, voltage gain modulation, and waveform. In the case where multiple power units are coupled to multiple electrodes, each electrode may receive a different time-varying voltage or the same time-varying voltage.

In some cases, the separation apparatus 100 may be a multi-frequency separator. Such a separator may have one electrode coupled to a power unit that applies a time-varying voltage having multiple frequency components to the electrode. Alternately, the separator may have two electrodes each coupled to a different power unit that applies a time-varying voltage to the electrode, where the two power units apply time-varying voltages that have different frequencies. One or more multi-frequency power units may be coupled to one or more electrodes disposed in the interior of the vessel 10 to create a time-varying voltage within the vessel 10. Waveforms such as sine waves, square waves, sawtooth waves, trapezoidal wave, triangular-shaped waves, exponential waves, logarithmic waves, semi-circular waves, inverse semi-circular waves, or other symmetrical or non-symmetrical shaped waves can be used, with any convenient variation and/or modulation of amplitude, frequency, and waveform, to produce a time-varying voltage. Two electrodes can be powered using time-varying voltages having different waveforms, different frequencies, different amplitudes, and/or different modulations. In other embodiments, one or more of the transformers 106 can be rectified to yield a modulated DC voltage.

Electrical separators of the type shown in FIG. 1, where an electrode is immersed into a separable liquid mixture having liquid phases with different electrical characteristics, exhibit behavior that can be modelled as an RC circuit with characteristic resistances, capacitances, and impedances. In particular, when a time-varying voltage is applied to one or more electrodes in the vessel, the system exhibits an impedance, and the current flowing through the power, reference, and/or ground circuits of the separator exhibits a phase shift relative to the time-varying voltage at the same location. The phase shift can be expressed as an angle, and is determined by the interaction of the applied voltage pattern and the response of the liquid mixture in the vessel. The phase angle can be measured by measuring voltage and current at a location over an interval, determining time stamps of wave peaks and troughs, and determining time shifts between corresponding wave peaks and troughs in the voltage and current measurements, leading to a simple calculation to yield the phase angle. When a separator such as the separator of FIG. 1 is used to separate oil from water, the relative amounts of oil and water affect the electrical properties of the liquid, and thus the phase angle exhibited when a given electrical stimulus is applied to the liquid. The phase angle varies directly with the volume of dispersed water, in some cases linearly, so separator performance can be adjusted by changing characteristics of the applied voltage. The inventors have found that minimizing the phase angle typically results in the best separation performance, which can be achieved by changing characteristics of the applied voltage.

The separation apparatus 100 includes one or more phase angle sensors 62 electrically coupled to the power circuit, the liquid mixture, the reference electrodes if any, and/or the reference or ground conductors attached to the vessel 10 or one or more of the power units 106 of FIG. 1. A sensor 62 is shown coupled to the vessel 10 at the vessel wall to sense electrical signals propagating through the liquid mixture in the vessel 10 from the one or more electrodes 28. Sensors 62 are also shown coupled to conductors 34 attached to the reference electrodes 30, here shown grounded, to sense electrical signals propagating from the electrodes 28 to the electrodes 30. Sensors 62 are also shown coupled to conductors 32 that couple respective secondary leads of the transformers 104 to the respective electrodes 28. Sensors 62 are also shown coupled to the primary leads 108 of the respective transformers 104. Finally, sensors 62 are shown coupled to ground leads of the power units 106. A separation apparatus such as the separation apparatus 100 may have one or more of the sensors 62 shown in FIG. 1. Because all these conductors are electrically coupled when the separator 100 is operating, phase angle can be determined at any of the foregoing locations to monitor and control the separation process. Each sensor 62 may be a phase angle sensor that directly measures the phase angle or a voltage and current sensor. Each sensor 62 is operatively coupled to the controller 60 to send signals representing the detected electrical characteristics of the system at the location of the sensor 62 to the controller 60. The controller 60 receives a signal representing the detected phase angle from the sensor 62, or the controller 60 receives signals representing detected voltage and current from the sensor 62 and determines phase angle from the signals.

The controller 60 can be configured to determine control adjustments to any of the aspects of the time-varying voltage applied to the first electrode 28 based on deviation of the detected or determined phase angle from a target value. In many cases, the target value will be zero, meaning the controller 60 will minimize the phase angle for optimal operation of the separation apparatus 100, but in some cases the target value may be non-zero. For example, an electrical separator, or separation plant comprising a plurality of electrical separators, can be cycled through a transient state if desired by applying a non-zero phase angle target to one or more of the controllers 60. In any event, one or more aspects of the time-varying voltage, such as frequency, amplitude, waveform, and/or gain, including frequency, amplitude, and shape of modulations thereof, can be adjusted according to standard feedback control techniques to adjust the phase angle toward the target value.

Figure 2:
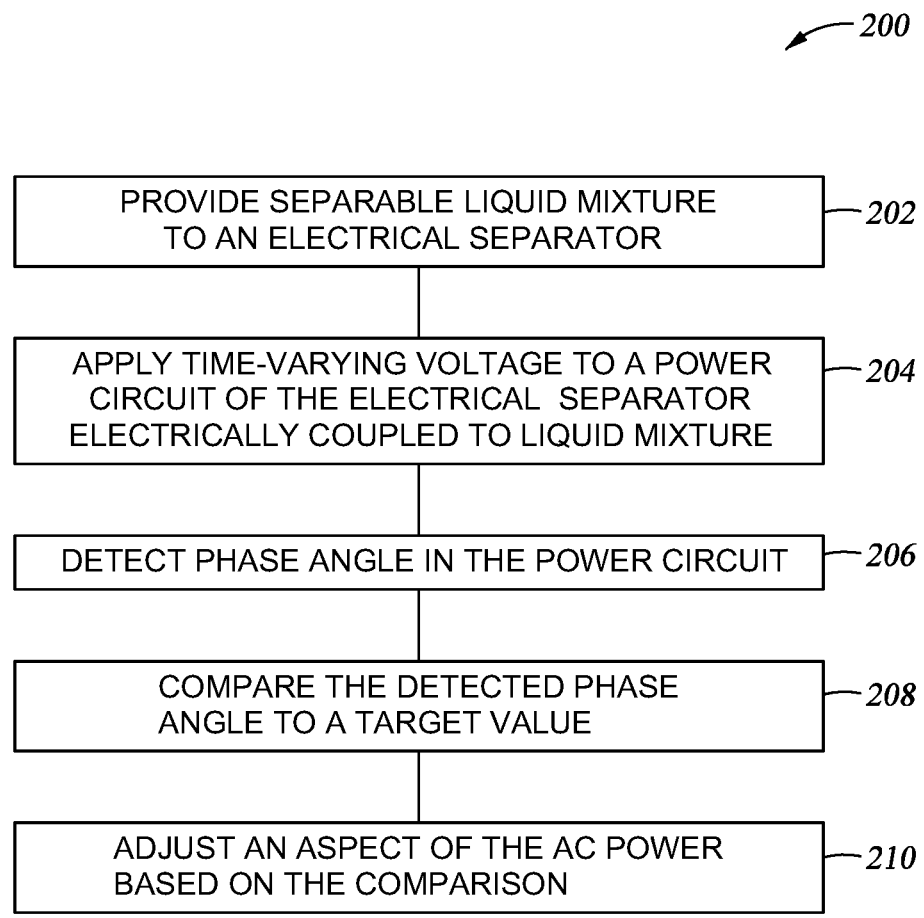
FIG. 2 is a flow diagram summarizing a method according to another embodiment.

FIG. 2 is a flow diagram illustrating a method 200 according to one embodiment. The method 200 can be practiced using the separation apparatus 100, or other types of separation apparatus, as further described below.

At 202, a separable liquid mixture, such as an oil/water mixture, is provided to an electrical separation apparatus. The electrical separation apparatus is a vessel that holds the liquid mixture and that has at least one electrode inside the vessel. The electrode is immersed in the liquid mixture to expose the liquid mixture to an electric field when electricity is applied to the electrode. The electric field can have a time-varying voltage, such as an unmodulated or modulated AC voltage, for example a time-varying voltage with frequency and/or amplitude modulation. Aspects of the time-varying electric field are selected to minimize or optimize time for separating the separable liquid phases.

At 204, time-varying voltage is applied to a power circuit electrically coupled to the liquid mixture by an electrode immersed in the liquid mixture. If multiple electrodes are immersed in the liquid mixture, the time-varying voltage may be applied to multiple electrodes, and may be the same for all electrodes or different. For example, the time-varying voltage may be applied to a first electrode of an electrode pair immersed in the liquid mixture. A second electrode of the electron pair immersed in the liquid mixture can be coupled to a reference potential via a current return path or secondary conduit. Multiple such electrode pairs can be used. Alternately, a time-varying voltage can be applied to a single electrode immersed in the liquid mixture. The single electrode electrically couples to a reference potential via the vessel wall or other conductor to establish a time-varying electric field in the liquid mixture. Where multiple electrode pairs are used, a second electrode of each electrode pair immersed in the liquid mixture can be coupled to the reference potential via the secondary power circuit. In the apparatus 100, the conductors 34 are each secondary conduits. The time-varying electric field established in the liquid mixture by applying the time-varying voltage to one or more electrodes immersed in the liquid mixture enhances separation of the separable liquid phases in the vessel, and the separable liquid phases, separated using the time-varying electric field, are removed from the vessel through separate outlets. The power circuit typically includes a power unit, which may include a transformer. The power unit is coupled to an electrode by a conductor. The electrode is immersed in the liquid mixture to apply a time-varying electric field to the liquid mixture. The power circuit includes a ground return path from the electrical separator to ground or to a reference potential of the power unit. The ground return path typically includes a conductor coupled to the electrical separator at any convenient location, such as a second electrode immersed in the liquid mixture or the vessel wall.

At 206, phase angle is detected in the system. Phase angle can be measured at any location of the entire electrically coupled system, such as at the vessel wall, at a single powered electrode, at a conductor connecting a power source to the single powered electrode, at either electrode of an electrode pair, at a conduit connecting an electrode to a reference potential, in either circuit (primary or secondary) of a transformer coupled into the power unit, at a ground lead of the power unit, or at more than one such location. In one aspect, phase angle is directly measured using a phase angle probe. In another aspect, electric potential and current are measured in the secondary conduit and phase angle is calculated from the measured potential and current according to known methods.

At 208, the detected phase angle is compared to a target value to determine whether the separation process in the vessel should be adjusted. Any aspect of a deviation from the target value can be considered in determining whether control is needed and to what extent control should be applied. In many cases, the target value for phase angle may be zero, where the objective is thus to minimize the phase angle. In most cases, the objective will be to minimize the phase angle, but in some cases the objective will be to achieve a non-zero value of the phase angle.

At 210, one or more characteristics of the separation process is adjusted based on the comparison of 208. One or more aspects of the time-varying voltage, such as frequency, amplitude, and/or shape, or a frequency, amplitude, and/or shape of any modulation thereof, can be adjusted. Additionally, if phase angle is detected at two or more locations in the electrically coupled system, more than one aspect of the time-varying voltage may be adjusted to control phase angle at the different locations.

The degree of adjustment can be determined by correlating variation in a control parameter, such as frequency, to variation in phase angle at the detection location at steady state. Such correlation can be used to define a process response function that can be used to tune a control loop based on the phase angle and the control parameter. Any control technology, such as PID tuning, can be used to define the control loop response to excursions from target.

In one aspect, an extra measure of control can be afforded by using a variable gain transformer such as an autotransformer. In the separation apparatus 100 of FIG. 1, any or all of the transformers 104 can be a variable gain transformer with variable primary and/or secondary circuits 108 and 110. One or more switches can be used to energize the variable portions of either the primary or the secondary circuits 108 and 110. The controller 60 can operate the switches to energize and de-energize portions of the variable transformer to adjust the voltage gain thereof as an additional way of controlling the phase angle of the secondary conduit. In addition to using voltage gain as an aspect of time-varying voltage to control phase angle, time variation of voltage gain can also be used. For example, the voltage gain can be modulated according to a frequency by driving the variable gain transformer at the desired frequency. In this way, frequency modulation can be applied to voltage gain as an additional control feature. Additionally, amplitude modulation can be applied, instead of or in addition to frequency modulation, to the voltage gain. Thus, use of a variable transformer allows at least three additional control variables to be applied to phase angle control in an electrical separator driven by time-varying power.

Figure 3:
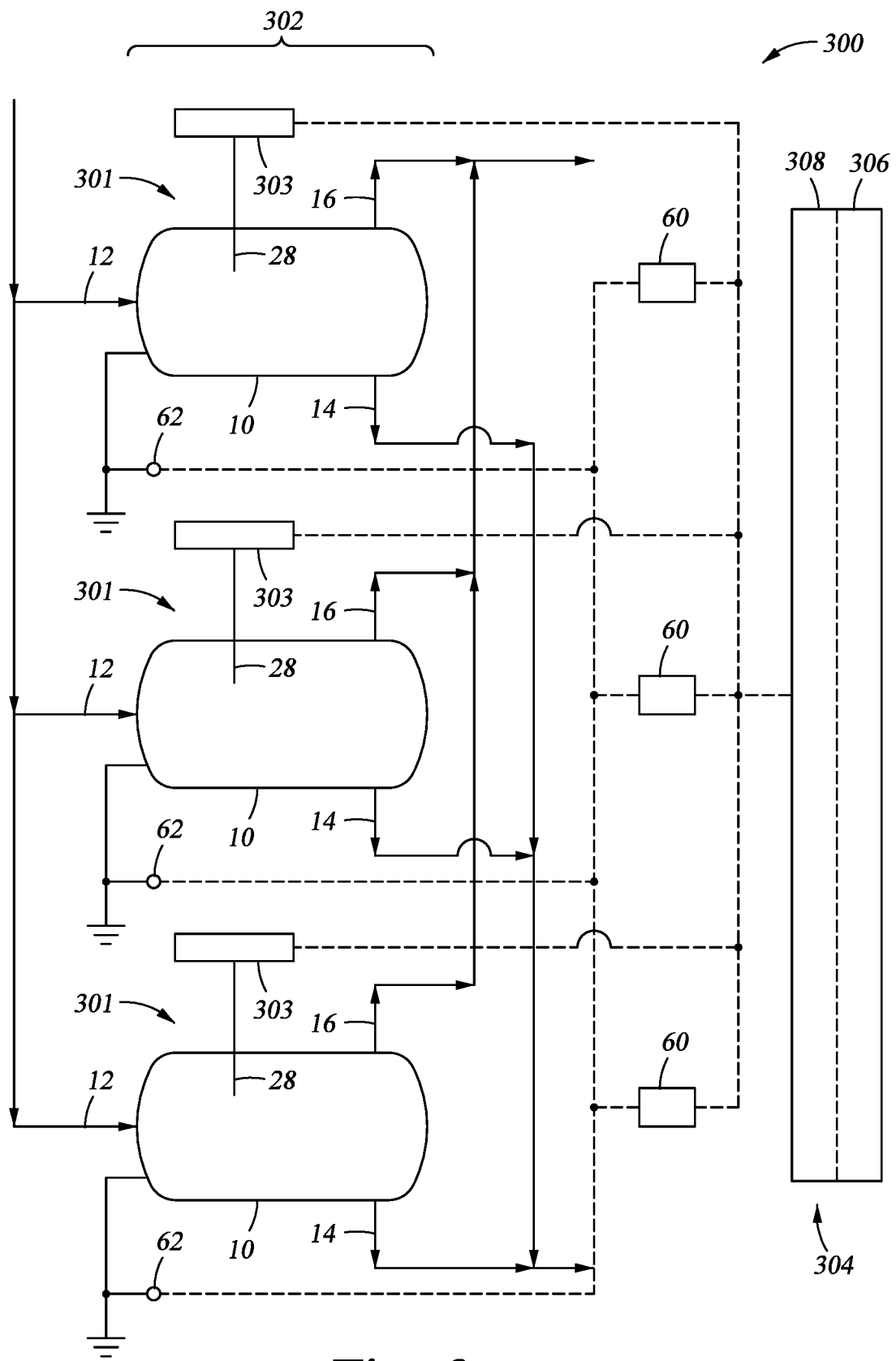
FIG. 3 is a schematic process diagram of a separation system according to another embodiment.

FIG. 3 is a schematic process diagram of a separation system 300 according to another embodiment. The separation system 300 features a plurality of electrical separators 302 each coupled to a data acquisition and processing system 304. The data acquisition and processing system 304 includes at least a digital processing system 306 and a network 308 that provides communication between the digital processing system and the plurality of electrical separators 302. The network 308 may be a closed network, or may utilize the internet for some functions. The network 308 may also include storage features.

The digital processing system 306 includes components standard for such systems, such as processors and storage, with optional input and output components such as displays and keyboards. The digital processing system 306 includes software for communicating signals to and from the electrical separators 302 using the network 308. The digital processing system 306 communicates with the controllers 60 of the separators 302 via the network 308, or optionally directly with the controllers 60 bypassing the network 308, or optionally directly with the sensors 62 of the separators 301.

In this case, each of the plurality of electrical separators 302 is the same type of electrical separator 301. Here, the electrical separators 301 each have a single power unit 303 electrically coupled to a powered electrode 28, and the data acquisition and processing system 304 is coupled to the controller 60 of each separator 301, or optionally directly to the sensor 62 and the power unit 303 of each separator 301. The separation system 300 divides an input liquid mixture among the electrical separators 301. The lighter liquid phases from the plurality of separators 302 can be combined following separation, and the heavier liquid phases from the plurality of separators 302 can likewise be combined following separation. The data acquisition and processing system 304 receives signals representing the phase angle from the sensor 62 or the controller 60 of each separator 301 and records the phase angle measurements from each separator 302 periodically or upon command. The digital processing system 306 can perform analysis of the phase angle measurements, including statistical analysis and trending. In this way, the digital processing system 306 can be configured to compute processing metrics that represent aspects of the liquid mixture being processed by the separation system 300 from the sensor readings of the separators 301. The digital processing system 306 can also be configured to compare set points of the power units 303 of the separators 301 and parameters determined by the controllers 60 of the separators 301, and to determine, from the set points and parameters, adjustments to the set points and/or the control parameters for individual controllers 60 based on the determined metrics of the liquid mixture feed stream.

Figure 4:
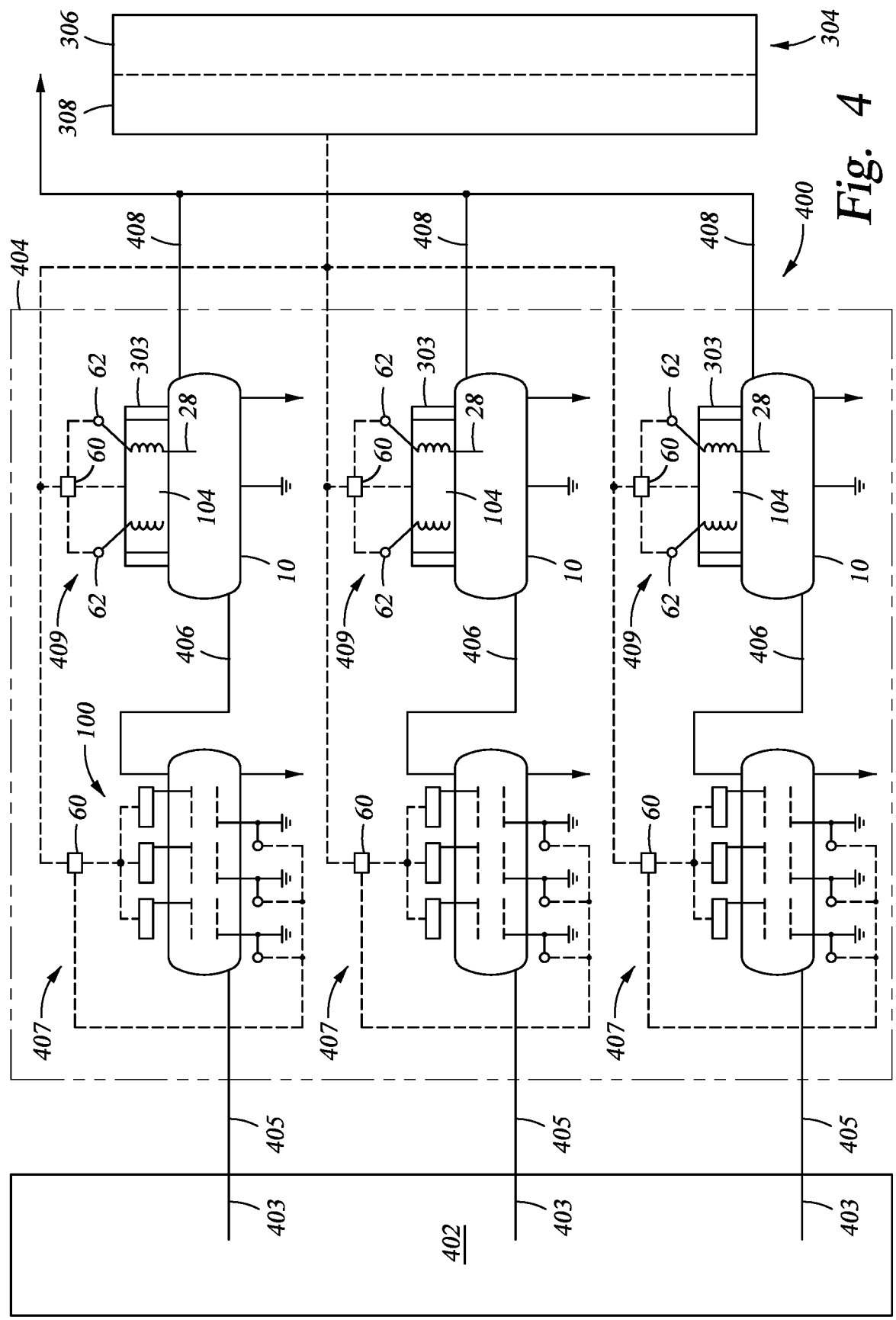
FIG. 4 is a configuration diagram of a separation system according to another embodiment.

FIG. 4 is a configuration diagram of a separation system 400 for processing reservoir fluids according to another embodiment. The system 400 includes a processing section 404 coupled to a hydrocarbon reservoir 402 at a plurality of locations 403. Hydrocarbons from the reservoir 402 are routed to the processing section 404 through conduits 405 that feed materials from the reservoir 402 to the processing section 404. The materials from the reservoir 402 include liquids and gases, and may include some entrained solids. The gases and solids may be at least partially removed prior to flowing into the processing section 404.

The processing section 404 includes a plurality of electrical separators to remove unwanted water, salts, acids, and other unwanted materials from the hydrocarbons. In this case, a plurality of first electrical separators 407 is provided to perform a first separation, and a plurality of second electrical separators 409 is provided to perform a second separation. Here, each of the first separators 407 is the separation apparatus 100 of FIG. 1, including the controller 60 and the sensors 62, and each of the second separators 409 is the electrical separator 301 of FIG. 3. This configuration of separators is an example of how electrical separators can be configured and operated collectively using phase angle detection to control the separators. Other configurations using multiple electrical separators can be structured to operate using phase angle control according to the needs of specific processes. Here, the plurality of first separators 407 separates wastewater from hydrocarbons and other unwanted materials, each separator 407 producing a hydrocarbon stream 406. Each of the first separators 407, in this case, is a dehydrator that separates hydrocarbon/water emulsions using time-varying electric fields. Each of the first separators 407 includes one or more sensors 62 to detect phase angle in the reference electrodes of the three electrode pairs.

Each hydrocarbon stream 406 is routed to a corresponding second separator 409. The second separators 409, in this case, are desalters that reduce residual salt levels in water contained in the hydrocarbon streams 406. Each second separator 409 has a sensor 62 coupled to the primary and secondary circuits of the transformer 104 of the power unit 303 thereof, but a single sensor may be used, and sensors may be coupled to any of one or more locations in the entire electrically coupled system of each second separator 409. As shown here, a single electrode 28 is immersed in the liquid mixture, and the vessel wall of the vessel 10 is grounded. Water is added to the streams 406, intimately contacted with the streams 406 to dilute salt in dispersed water contained in the streams 406, and then the expanded water phase, with lower salt content, is separated from the streams 406 using time-varying electric fields in the second separators 409. The sensors 62 of the second separators 409 sense phase angle in the primary and secondary circuits of the transformers 104.

The second separators 409 produce product hydrocarbon streams 408 that can be combined into a single product stream as shown in FIG. 4.

The processing section 404 is operatively coupled to a data acquisition and processing system such as the system 304 described in connection with FIG. 3. Here, the controllers 60 of the individual separators in the processing section 404 are coupled to the digital processing system 306 via the network 308. The controllers 60 are here configured to communicate processing data of the separators 407 and 409 to the digital processing system 306 and to receive control signals from the digital processing system 306.

Here, the digital processing system 306 can be configured to monitor the process data from the individual controllers 60 and to compare the process conditions of the separators 407 and 409 as the separators pursue their individual phase angle targets. Differences among separators of the same type can be highlighted and/or correlated with other process conditions. Trends can be compared by regressing for rate of change. Timing of identifiable events can be compared and related to other process conditions or reservoir conditions. Differences among separators of different types can also be compared to identify process events and conditions. The digital processing system 306 can be configured to send control signals to the controllers 60 of the various separators 407 and 409 to adjust operation of the system 400 by adjusting goals of the various controllers 60 individually or collectively.

Figure 5:
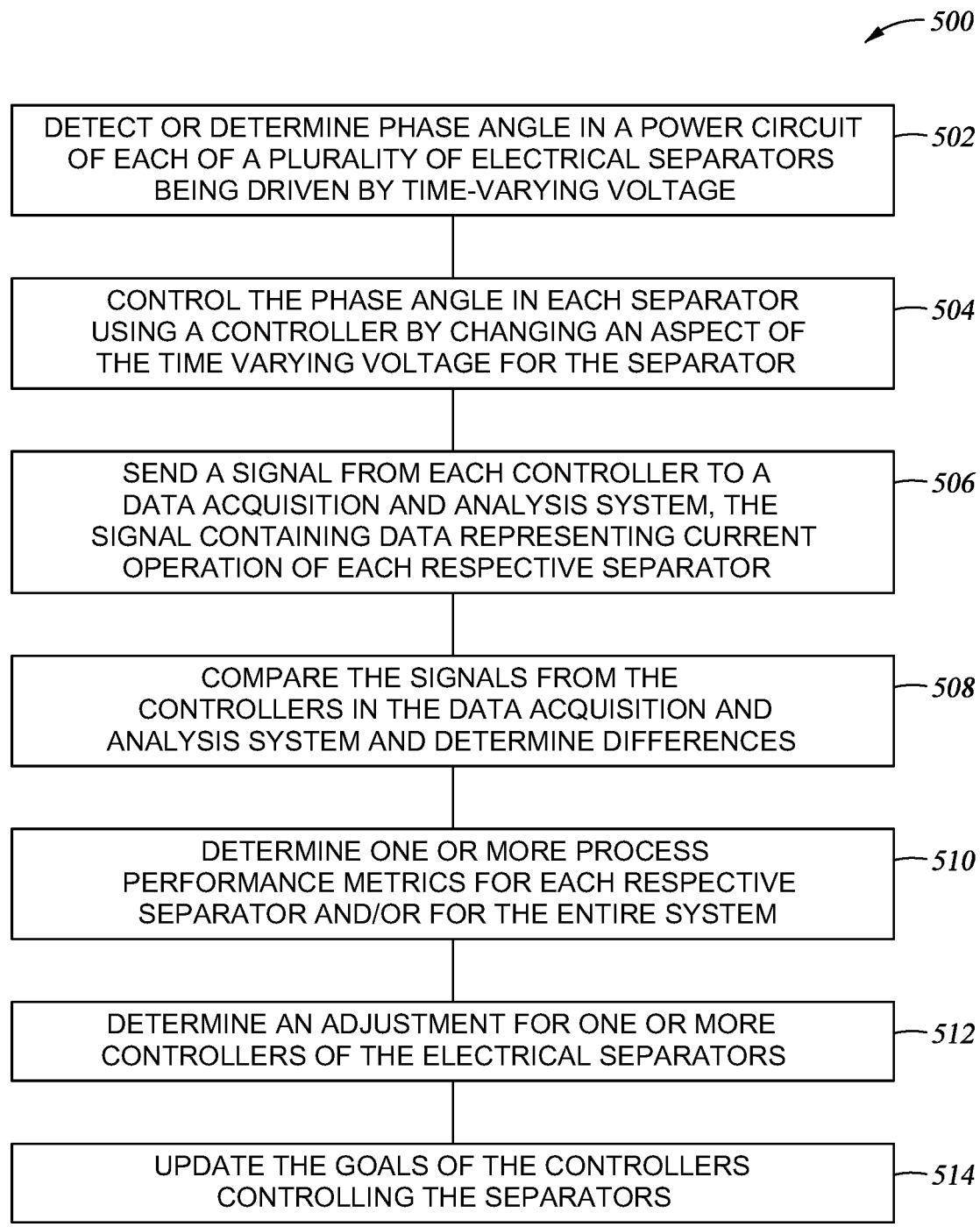
FIG. 5 is a flow diagram summarizing a method according to another embodiment.

FIG. 5 is a flow diagram summarizing a method 500 according to another embodiment. The method 500 can be used with the separation systems 300 and 400, or any separation system involving a plurality of separators having phase angle control as described herein. The method 500 is useful for controlling separators in a separation system that separates separable liquids from a mixture thereof. The method 500 ensures that electrical conditions of the separators are maintained within a desired range or domain for a desired process.

At 502 phase angle is detected or determined in a power circuit of each of a plurality of electrical separators being driven by time-varying voltage. The phase angle is detected or determined using a sensor that directly senses phase angle at any point in the electrically coupled system, for example in the power unit, at primary or secondary circuits of a transformer, or a ground lead, of the power unit, or at the vessel wall, or at a reference electrode or conductor connected to a reference potential. Alternately, the sensors may detect voltage and current and a processor can determine phase angle from the detected current and voltage.

At 504, the determined phase angle of each electrical separator is controlled by a respective controller of each electrical separator by changing an aspect of the time-varying voltage applied to the respective electrical separator. Each controller has a target value for phase angle, and adjusts one or more aspects of the time-varying voltage, such as frequency, amplitude, modulation, waveform, gain, and gain modulation. Each controller may have the same control loop and tuning, or different control loops and tuning may be used. For example, in electrical separators of different types, different control loops and/or tuning may be used. For example, an electrical separator of a first configuration may exhibit a first phase angle response when the various aspects of the time-varying power are adjusted, while an electrical separator of a second configuration different from the first configuration may exhibit a second phase angle response, different from the first phase angle response, when the same aspects of the time-varying voltage are adjusted. Different control loops and/or tuning may be used to control the two electrical separators based on their responses.

At 506, the controllers of the electrical separators send signals to a data acquisition and analysis system. The signal from each controller contains data representing current operation of the respective electrical separator. The data may include current phase angle target and actual value, along with set points and actual values of various aspects of the time-varying power. Temperatures, pressures, flow rates, levels, impedances, and other process parameters may also be included in the signal. The signal may be sent periodically according to a set pattern, which may be regular or complex, and/or the signal may be sent upon request from the data acquisition and analysis system.

At 508, the data analysis and acquisition system compares the signals from the controllers and determines differences. Certain variables may be specified for the comparison. For example, a comparison can be done for all separators of the same type or at the same location. Any collection of parameters can be specified for the comparison. The differences determined by the comparison may be related to known process and equipment situations that can be managed by changing separator operation. A model can be updated and refined using data from a plurality of separators.

At 510, the data analysis and acquisition system optionally determines one or more process performance metrics for each respective separator and/or for the entire system. Such metrics may include metrics indicating energy efficiency and separation efficiency. Examples include total energy usage, specific energy usage (energy used per unit mass), total separation efficiency and/or time, total and/or specific energy usage per unit efficiency and/or unit time, and reservoir metrics such as hydrocarbon-water ratios.

At 512, the data analysis and acquisition system determines an adjustment for one or more controllers of the electrical separators. The differences and process metrics determined above may be used, along with a physical, statistical, or heuristic model of the separators, individually or collectively, to determine the adjustments. Each individual adjustment may be based on analysis of data from any or all of the plurality of controllers. Additionally, each individual adjustment may also be based on analysis of historical data from electrical separators that may now be out of service.

At 514, the data analysis and acquisition system updates the goals of the controllers that control the individual electrical separators. The method 500 can be repeated using a control loop configured to perform the method 500.

While the foregoing is directed to embodiments of the present invention, other and further embodiments of the present disclosure may be devised without departing from the basic scope thereof, and the scope thereof is determined by the claims that follow.

What is claimed is:

1. A method of performing a separation process, comprising:
   providing a plurality of feed streams to a separation plant, each feed stream comprising at least two separable liquid phases, the separation plant comprising a plurality of separation trains, each separation train comprising at least two electrical separators, at least one of which is powered by time-varying voltage;
   flowing the feed streams through respective separation trains of the separation plant while applying time-varying voltage to at least one separator of each separation train;

detecting or determining the phase angle in a power circuit of each separator receiving time-varying voltage;

using a controller for each separator to adjust a characteristic of the time-varying voltage for that separator based on the phase angle of that separator;

providing operating parameters of the separators to a data acquisition and analysis system;

comparing the operating parameters of the separators in the data acquisition and analysis system;

adjusting a goal of each controller based on the comparison; and cycling the separation plant through a transient phase by applying a non-zero phase angle target to the controller of one of more separators of the separation plant.

2. The method of claim 1, wherein at least one separator of each separation train includes a powered electrode and a reference conductor, and time-varying voltage is independently provided to each powered electrode.

3. The method of claim 2, wherein the characteristic of each first time-varying voltage is selected, in each case independently, from the group consisting of frequency, amplitude, frequency modulation, amplitude modulation, voltage gain, voltage gain modulation, and waveform.

4. The method of claim 3, wherein the data acquisition and analysis system also compares the operating parameters of the separators to historical data and to data from other separation plants.

5. The method of claim 4, wherein the data acquisition and analysis system also adjusts the controller of each separator based on the comparison to the historical data.

6. The method of claim 1, wherein one or more of the electrical separators is operated using multi-frequency AC voltage.

7. The method of claim 6, wherein at least one of the feed streams is an oil/water mixture.

8. The method of claim 7, wherein each controller is configured to minimize the phase angle in each separator.

9. The method of claim 7, wherein each controller is configured to minimize more than one phase angle for each separator by adjusting two or more of frequency, amplitude, frequency modulation, amplitude modulation, voltage gain, voltage gain modulation, and waveform of each separator.

* * * * *